United States Patent
Lin et al.

(10) Patent No.: US 6,649,474 B1
(45) Date of Patent: Nov. 18, 2003

(54) METHOD FOR FABRICATING A SOURCE LINE OF A FLASH MEMORY CELL

(75) Inventors: Chi-Hui Lin, Taipei (TW); Chung-Lin Huang, Taichung (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/426,331

(22) Filed: Apr. 30, 2003

(30) Foreign Application Priority Data

Jul. 9, 2002 (TW) .......................................... 91115155 A

(51) Int. Cl.[7] .......................................... H01L 21/8247
(52) U.S. Cl. ........................................ 438/266; 438/595
(58) Field of Search ................................ 438/257–267, 438/593, 594, 595

(56) References Cited

U.S. PATENT DOCUMENTS

| | | | | |
|---|---|---|---|---|
| 5,070,032 A | * | 12/1991 | Yuan et al. | 438/267 |
| 5,631,179 A | * | 5/1997 | Sung et al. | 438/264 |
| 5,686,332 A | * | 11/1997 | Hong | 438/261 |
| 5,756,385 A | * | 5/1998 | Yuan et al. | 438/258 |
| 6,218,246 B1 | * | 4/2001 | Kwon | 438/267 |
| 6,232,179 B1 | * | 5/2001 | Sato | 438/257 |
| 6,265,265 B1 | * | 7/2001 | Lim | 438/257 |
| 2002/0142545 A1 | * | 10/2002 | Lin | 438/257 |

* cited by examiner

Primary Examiner—Richard Booth
(74) Attorney, Agent, or Firm—Nelson A. Quintero

(57) ABSTRACT

A method for fabricating a source line of a flash memory cell. First, a substrate covered by a first insulating layer, a first conductive layer, and a second insulating layer successively is provided. Next, the second insulating layer is patterned to form an opening over the substrate and expose the first conductive layer. Next, a first spacer is formed over the sidewall of the lower opening and a second spacer is formed over the sidewall of the upper opening and the first spacer to make the opening has a "T" profile. Next, the exposed first conductive layer under the opening is removed, and a third spacer over the sidewall of the first spacer and the second spacer is formed. Finally, a source region is formed in the substrate under the opening and the opening is filled with a second conductive layer to form a source line.

20 Claims, 5 Drawing Sheets

METHOD FOR FABRICATING A SOURCE LINE OF A FLASH MEMORY CELL

BACKGROUND OF THE INVENTION

1. Field of the Invention

The present invention relates in general to a method for fabricating a semiconductor device. More particularly, it relates to a method for fabricating a source line of a flash memory cell that increases its top area.

2. Description of the Related Art

Non-volatile memory, such as flash memory, stores data regardless of electrical power supplied, and reads and writes data by controlling a threshold voltage of a control gate. Conventionally, flash memory includes a floating gate and a control gate. The floating gate stores charge and the control gate reads and writes data. In addition, the floating gate is located under the control gate and is not connected to external circuit, while the control gate connects to the word line. One of the advantages of flash memory is its capacity for block-by-block memory erasure. Furthermore, memory erasure is fast, and normally takes just 1 to 2 seconds for the complete removal of a whole block of memory. Therefore, in recent years, it has been widely applied to consumer electronics devices, such as digital cameras, mobile phones, personal stereos, and laptops.

FIG. 1 is a cross-section showing a conventional flash memory cell structure. The memory cell includes a silicon substrate 100 having a source region S therein. A source line 110 is disposed on the source region S. A floating gate 104 and silicon oxide layer 106 are disposed over the outside source line 110. Moreover, the floating gate 104 is insulated from the substrate 100 by a silicon oxide layer 102 and insulated from the source line 110 by a spacer 108. A control gate 114, such as a conductive spacer, is disposed over the outside floating gate 104 and insulated therefrom by silicon oxide layer 113.

In this flash memory cell structure, in order to reduce the resistance of the control gate 114 and source line 110, a thin metal silicide (not shown) layer, such as titanium silicide (TiSi), is usually formed on the top surface. With the size of individual semiconductor devices reduced to increase density on the integrated circuit (IC) chip, the source line 110 width must be reduced to achieve a memory cell with a minimum size. However, when the source line 110 width is less than 0.2 μm, a titanium silicide layer cannot be formed on the source line 110 successfully and requires use of cobalt silicide (CoSi). Accordingly, the manufacturing cost is increased due to changed processing apparatus for forming cobalt silicide layer. Otherwise, the integration of IC is reduced since the size of devices cannot be.

SUMMARY OF THE INVENTION

Accordingly, an object of the invention is to provide a novel method for fabricating a source line of a flash memory cell to form a source line having a "T" profile, thereby increasing its top area.

Another object of the invention is to provide a novel method for fabricating a source line of a flash memory cell to reduce the resistance of the source line still by titanium silicide when the size of the device is shrunk.

According to one aspect, the invention provides a method for fabricating a source line of a flash memory cell. First, a substrate covered by a first insulating layer, a first conductive layer, and a second insulating layer successively is provided. Next, the second insulating layer is patterned to form an opening over the substrate and expose the first conductive layer. Next, a first spacer is formed over the sidewall of the lower opening and a second spacer is formed over the sidewall of the upper opening and the first spacer. Next, the exposed first conductive layer under the opening is removed, and a third spacer over the sidewall of the first spacer and the second spacer is formed. Finally, the opening is filled with a second conductive layer to serve as a source line. Moreover, the method further comprises a step of forming a source region in the substrate under the opening, connected to the second conductive layer.

Moreover, the first insulating layer is silicon oxide and the second insulating layer is silicon nitride. The first and second conductive layers are polysilicon. The first, second, and third spacers are silicon oxide.

DESCRIPTION OF THE DRAWINGS

For a better understanding of the present invention, reference is made to a detailed description to be read in conjunction with the accompanying drawings, in which.

DETAUKED DESCRIPTION OF THE INVENTION

Figure 1:
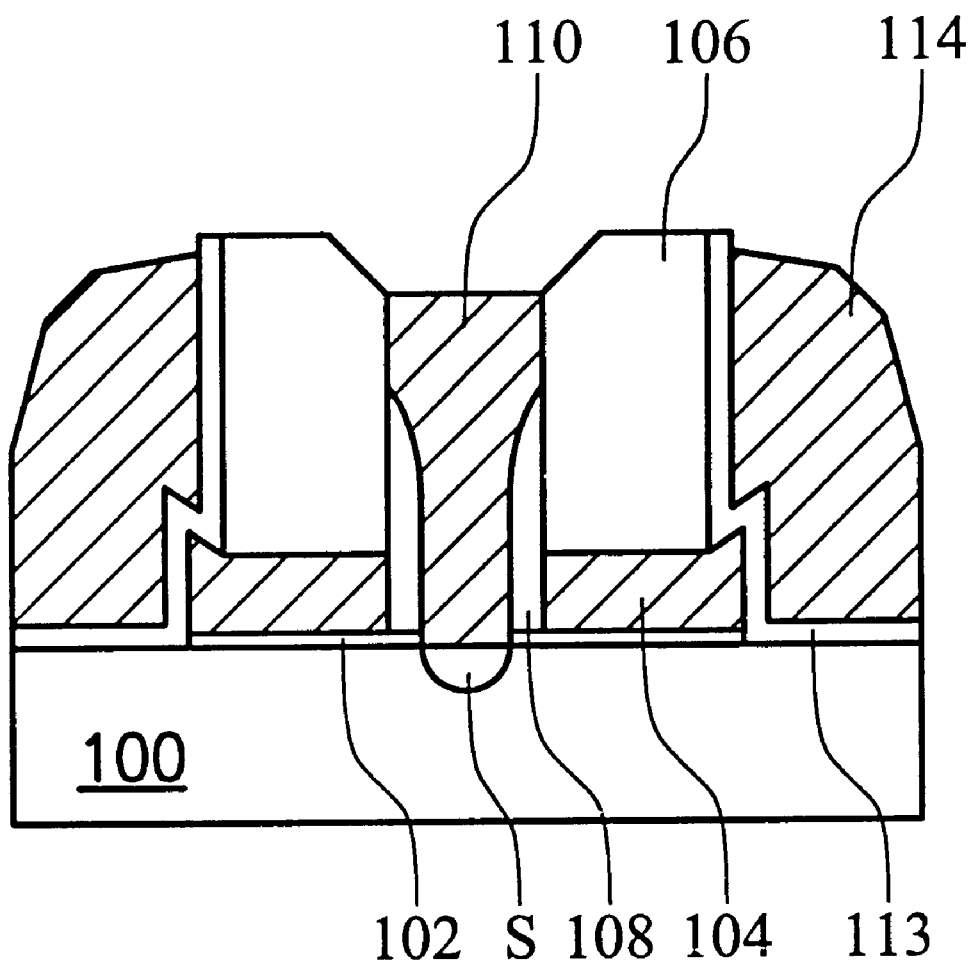
FIG. 1 is a cross-section showing a conventional flash memory cell structure.
Figure 2:
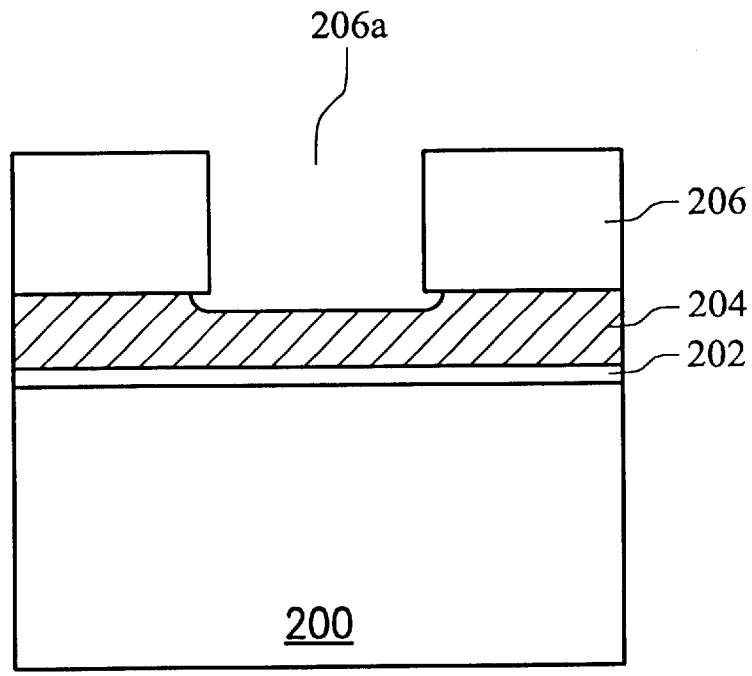
FIGS. 2 to 8 are cross-sections showing a method for fabricating a source line of a flash memory cell according to the present invention.

A preferred embodiment of the invention is now described with reference to FIGS. 2 to 9. First, in FIG. 2, a substrate 200, such as a silicon substrate, is provided. Next, a first insulating layer 202, a first conductive layer 204, and a second insulating layer 206 are successively deposited on the substrate 200 by conventional deposition, such as thermal oxidation and chemical vapor deposition (CVD). For example, the first insulating layer 202 is a thin silicon oxide layer. The first conductive layer 204 can be polysilicon and the second insulating layer 206 can be silicon nitride. The second insulating layer 206 is patterned by conventional lithography and etching to form an opening 206a and expose a part of the first conductive layer 204. Subsequently, isotropic etching, such as wet etching, is performed on the exposed first conductive layer 204 using the insulating layer 206 as a mask to recess the exposed first conductive layer 204, thereby forming a floating gate having a sharp portion for discharge in subsequent process.

Figure 3:
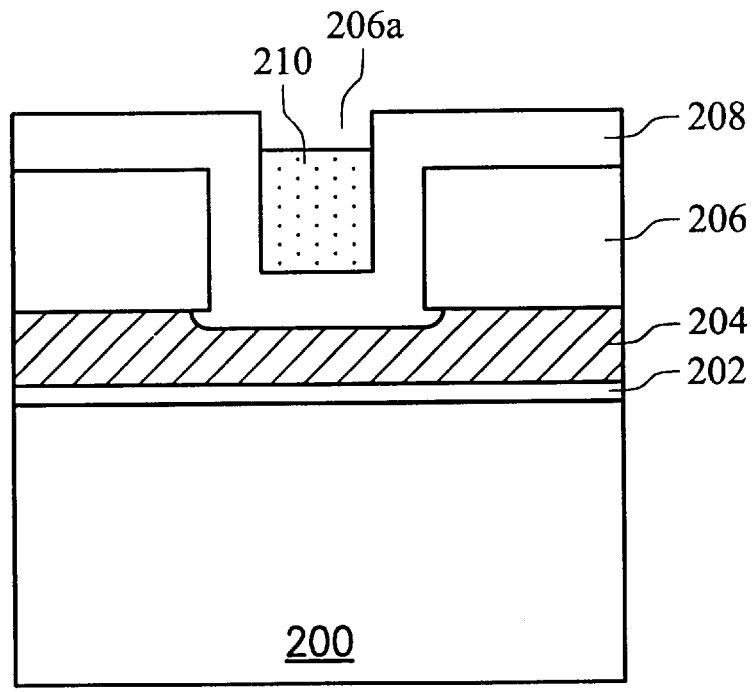

Next, in FIG. 3, a conformable third insulating layer 208, such as silicon oxide formed by CVD using tetraethyl orthosilicate (TEOS) as a reaction gas, is deposited on the second insulating layer 206 and the surface of the opening 206a. In this invention, the third insulating layer has a thickness of about 1200~2500 Å. A photoresist layer (not shown) is coated on the third insulating layer 208 and fills in the opening 206a completely. Thereafter, the photoresist layer is etched back to expose the third insulating layer 208 and leave a part of photoresist layer 210 in the opening 206a.

Figure 4:
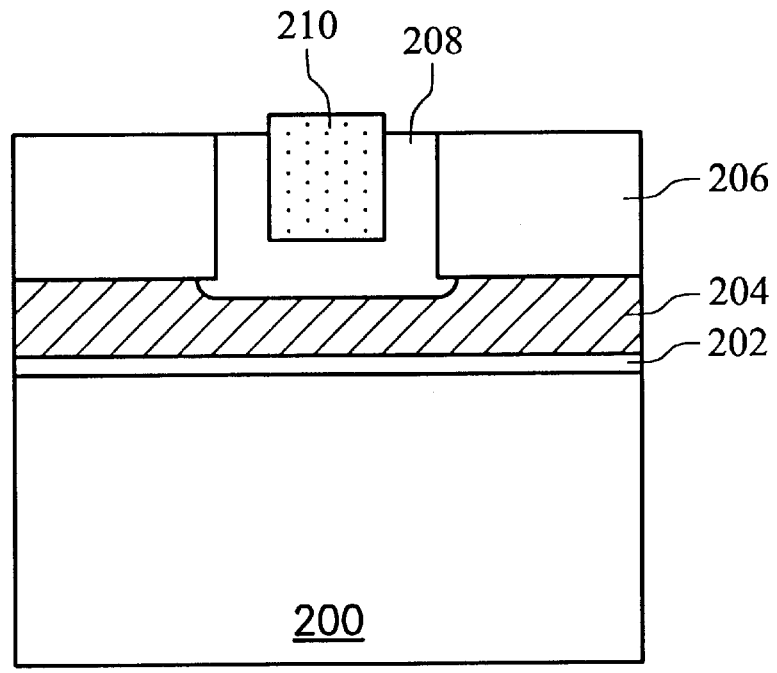

Next, in FIG. 4, the third insulating layer 208 is etched to expose the second insulating layer 206 by wet dipping using the remaining photoresist layer 210 as a mask.

Figure 5:
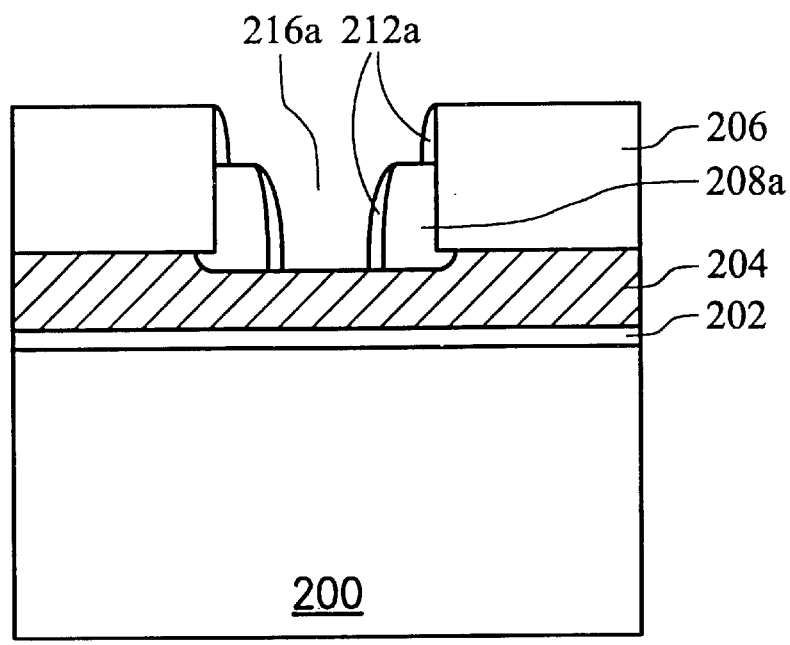

Next, in FIG. 5, after the remaining photoresist layer 210 is removed, anisptropic etching is performed on the third insulating layer 208 to form a first spacer 208a over the sidewall of the lower opening 206a and expose the first conductive layer 204. After the first spacer 208a is formed, the original opening 206a becomes an opening 216a having a "T" profile, as shown in FIG. 5. The object of forming the opening 216a having a "T" profile will be described later. Thereafter, a conformable silicon oxide layer (not shown) is deposited on the second insulating layer 206 and the surface of the opening 216a. Also, anisotropic etching is performed on the silicon oxide layer to form a second spacer 212a over the sidewall of the upper opening 216a and the first spacer 208a.

Figure 6:
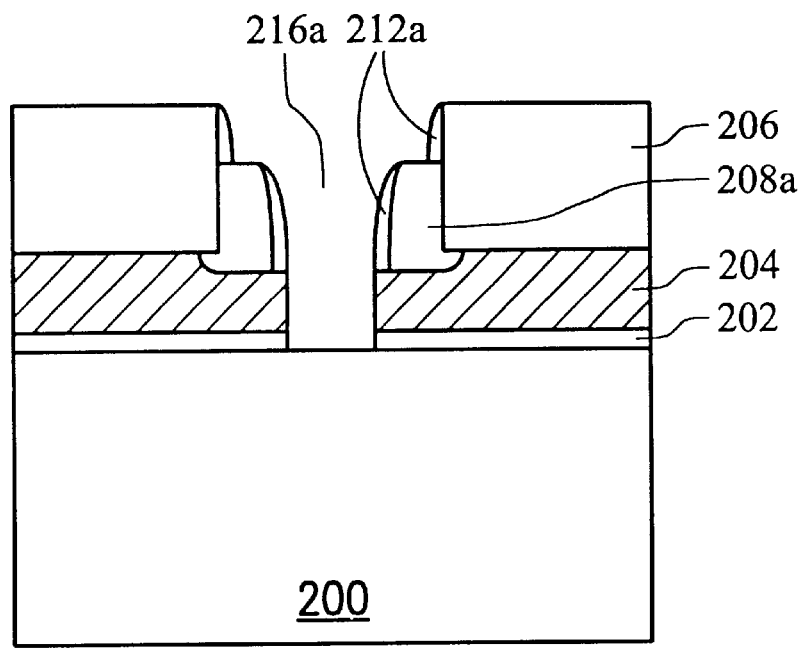

Next, in FIG. 6, the exposed first conductive layer 204 and the first insulating layer 202 under the opening 216a are removed to expose the substrate 200.

Figure 7:
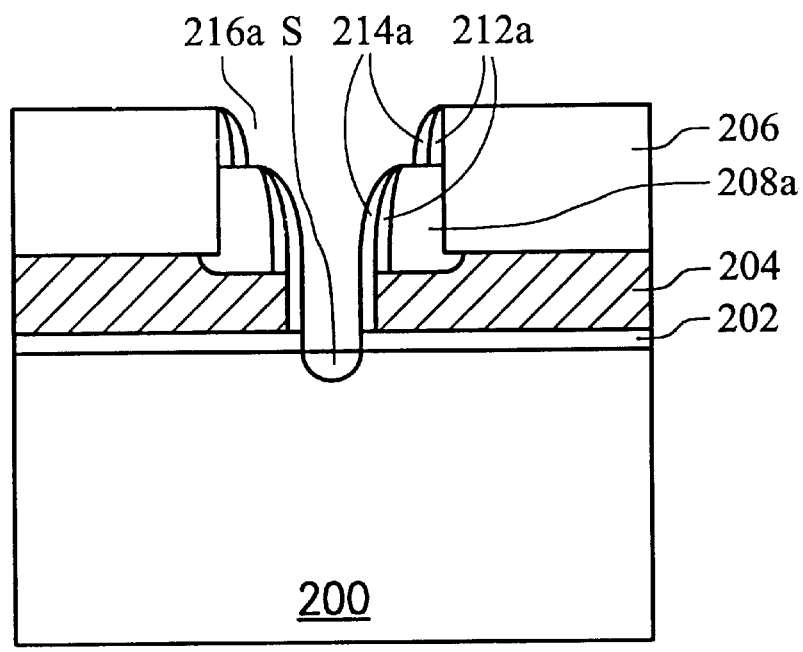

Next, in FIG. 7, a conformable silicon oxide layer (not shown), such as high temperature oxide (HTO) with a thickness of about 350~400 Å, is deposited on the second insulating layer 206 and the surface of the opening 216a by CVD. Also, anisotropic etching is performed on the silicon oxide layer to form a third spacer 214a over the sidewall of the second and first spacers 212a, 208a and expose the substrate 200. Thereafter, ion implantation is performed on the exposed substrate 200 to form a doping region S inside to serve as a source region.

Figure 8:
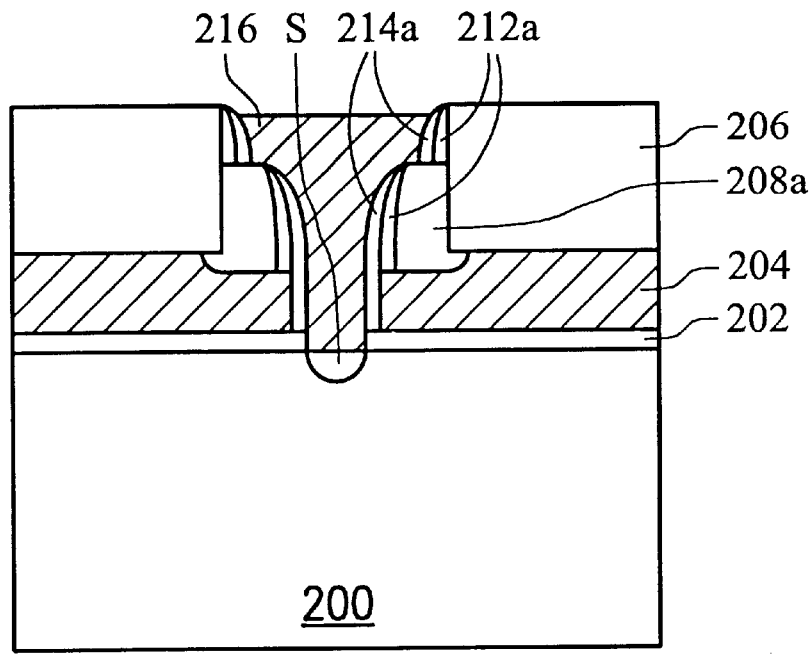

Finally, in FIG. 8, a second conductive layer (not shown) is deposited on the second insulating layer 206 and fills in the opening 216a completely to connect with the source region S. In this invention, the second conductive layer 216 can be polysilicon and has a thickness of about 2000~4000 Å. Thereafter, the excess second conductive layer 216 formed on the second insulating layer 206 is removed by chemical mechanical polishing (CMP) or dry etching to leave a part of second conductive layer 216 in the opening 216a to serve as a source line.

Figure 9:
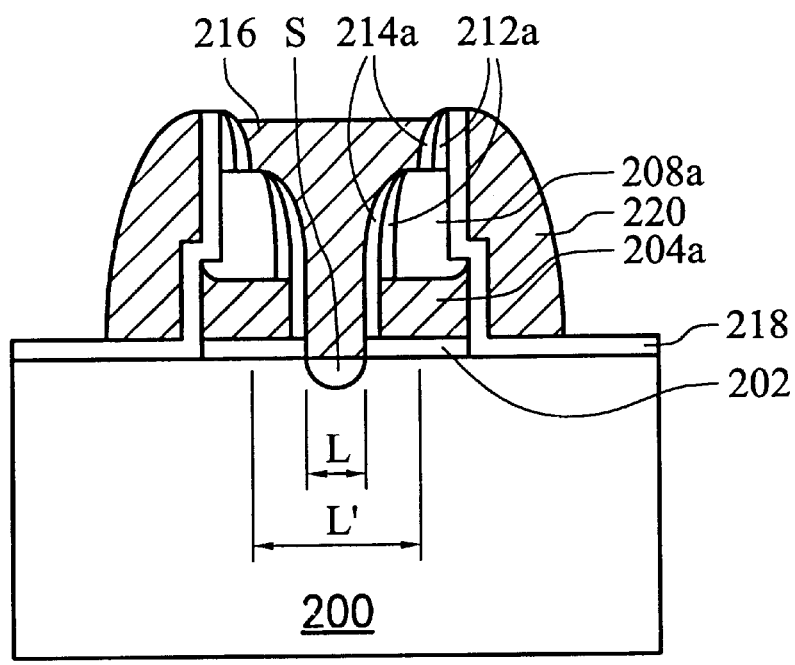
FIG. 9 is a cross-section showing a flash memory cell structure according to the present invention.

FIG. 9 is a cross-section showing a flash memory cell structure according to the present invention. After the fabrication of the source line 216 is finished, a silicon oxide layer (not shown) is formed on the source line 216 by thermal oxidation. Next, the second insulating layer 206 is removed to expose the first conductive layer 204. Thereafter, anisotropic etching is performed on the exposed first conductive layer 204 to expose the first insulating layer 202. The remaining first conductive layer 204a under the first and second spacers 208a, 212a, with a sharp portion for discharge, serves as a floating gate. The silicon oxide layer formed on the source line 216 and the exposed first insulating layer 202 are then removed to expose the substrate 200 and the source line 216. Next, a control gate 220, such as polysilicon, is formed over the sidewall of the floating gate 204a. The control gate 220 is insulated from the substrate 200 and floating gate 204a by a silicon oxide layer 218. As mentioned above, in order to reduce the resistance of the source line 216, thin metal silicide (not shown) layer, such as TiSi, is usually formed on its top surface. In this invention, since the source line 216 is formed in the opening 216a having a "T" profile, the source line 216 also has a "T" profile. Accordingly, the width L' of top surface of the source line 216 is longer than the width L (source line width) of its bottom surface. That is, when the source line width L is shrunk, TiSi can still be formed on the source line due to the source line still has enough top area.

Compared with the prior art, when the source line width is shrunk to increase integration of IC, the present invention can still use original process apparatus to form TiSi with no need for additional process apparatus to form CoSi, even if the source line width is less than 0.2 μm. Therefore, the manufacturing cost can be reduced.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a source line of a flash memory cell, comprising the steps of:

providing a substrate covered by a first insulating layer, a first conductive layer, and a second insulating layer successively;

patterning the second insulating layer to form an opening having a lower and upper part over the substrate and expose the first conductive layer;

forming a first spacer over the sidewall of the lower part of the opening;

forming a second spacer over the sidewall of the upper part of the opening and the first spacer;

removing the exposed first conductive layer under the opening;

forming a third spacer over the sidewall of the first spacer and the second spacer; and filling the opening with a second conductive layer to serve as a source line.

2. The method as claimed in claim 1, further comprising a step of forming a source region in the substrate, connected to the second conductive layer.

3. The method as claimed in claim 1, further comprising the steps of:

removing the second insulating layer and the underlying first conductive layer and the underlying first insulating layer to form a floating gate composed of the remaining first conductive layer under the first spacer; and forming a control gate over the sidewall of the floating gate and insulated from the substrate and the floating gate.

4. The method as claimed in claim 3, wherein the control gate is polysilicon.

5. The method as claimed in claim 1, wherein the substrate is silicon.

6. The method as claimed in claim 1, wherein the first insulating layer is silicon oxide.

7. The method as claimed in claim 1, wherein the first conductive layer and the second conductive layer are polysilicon.

8. The method as claimed in claim 1, wherein the second insulating layer is silicon nitride.

9. The method as claimed in claim 1, wherein the first spacer is silicon oxide.

10. The method as claimed in claim 1, wherein the second spacer is silicon oxide.

11. The method as claimed in claim 1, wherein the third spacer is silicon oxide.

12. A method for fabricating a source line of a flash memory cell, comprising the steps of:

providing a substrate covered by a silicon oxide layer, a first polysilicon layer, and a silicon nitride layer successively;

patterning, the silicon nitride layer to form an opening having a lower and upper part over the substrate and expose the first polysilicon layer;

forming a first spacer over the sidewall of the lower part of the opening;

forming a second spacer over the sidewall of the upper part of the opening and the first spacer;

removing the exposed first polysilicon layer under the opening;

forming a third spacer over the sidewall of the first spacer and the second spacer;

filling the opening with a second polysilicon layer;

removing the silicon nitride layer and the underlying first polysilicon layer and the underlying silicon oxide layer to form a floating gate composed of the remaining first polysilicon layer under the first spacer; and forming a control gate over the sidewall of the floating gate and insulated from the substrate and the floating gate.

13. The method as claimed in claim 12, further comprising a step of forming a doping region in the substrate, connected to the second polysilicon layer.

14. The method as claimed in claim 13, wherein the doping region is a source region.

15. The method as claimed in claim 12, wherein the substrate is silicon.

16. The method as claimed in claim 12, wherein the first spacer is silicon oxide.

17. The method as claimed in claim 12, wherein the second spacer is silicon oxide.

18. The method as claimed in claim 12, wherein the third spacer is silicon oxide.

19. The method as claimed in claim 12, wherein the control gate is polysilicon.

20. The method as claimed in claim 19, wherein the second polysilicon layer serves as a source line.

* * * * *